(12) United States Patent
Sadhu et al.

(10) Patent No.: US 10,727,809 B2
(45) Date of Patent: Jul. 28, 2020

(54) BULK ACOUSTIC WAVE RESONATOR WITH MULTILAYER PIEZOELECTRIC STRUCTURE

(71) Applicant: Qorvo US, Inc., Greensboro, NC (US)

(72) Inventors: Jyothi Swaroop Sadhu, Apopka, FL (US); Maria Wang, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 190 days.

(21) Appl. No.: 15/826,039

(22) Filed: Nov. 29, 2017

(65) Prior Publication Data

US 2018/0175826 A1   Jun. 21, 2018

Related U.S. Application Data

(60) Provisional application No. 62/434,838, filed on Dec. 15, 2016.

(51) Int. Cl.
*H03H 9/60* (2006.01)
*H03H 9/56* (2006.01)
*H03H 9/17* (2006.01)
*H03H 9/205* (2006.01)
*H03H 9/13* (2006.01)
(Continued)

(52) U.S. Cl.
CPC ........ *H03H 9/605* (2013.01); *H03H 9/02031* (2013.01); *H03H 9/131* (2013.01); *H03H 9/175* (2013.01); *H03H 9/176* (2013.01); *H03H 9/205* (2013.01); *H03H 9/562* (2013.01); *H03H 9/564* (2013.01); *H03H 9/568* (2013.01); *H03H 9/583* (2013.01); *H03H 9/589* (2013.01)

(58) Field of Classification Search
CPC .... H03H 9/02031; H03H 9/131; H03H 9/175; H03H 9/176; H03H 9/205; H03H 9/562; H03H 9/564; H03H 9/568; H03H 9/173; H03H 9/174; H03H 9/581; H03H 9/582; H03H 9/587–589; H03H 9/605; H03H 9/583
USPC .................................................. 333/187, 189
See application file for complete search history.

(56) References Cited

U.S. PATENT DOCUMENTS 7,199,683 B2 *  4/2007  Thalhammer ........ H03H 9/0211
                                                            333/187
8,525,619 B1 *  9/2013  Olsson ............... H03H 9/02228
                                                            310/324

(Continued)

FOREIGN PATENT DOCUMENTS

JP    2007-208845 A  *  8/2007
JP    2008-211392 A  *  9/2008

OTHER PUBLICATIONS

English language machine translation of JP 2008-211392 A, published Sep. 11, 2008, 10 pages. (Year: 2008).*

*Primary Examiner* — Barbara Summons
(74) *Attorney, Agent, or Firm* — Withrow & Terranova, P.L.L.C.

(57) ABSTRACT

A bulk acoustic wave (BAW) resonator has a bottom electrode, a top electrode over the bottom electrode, and a multilayer piezoelectric structure between the bottom electrode and the top electrode. The multilayer piezoelectric structure has a first piezoelectric layer having a first electromechanical coupling coefficient and a second piezoelectric layer having a second electromechanical coupling coefficient that is different than the first electromechanical coupling coefficient.

25 Claims, 12 Drawing Sheets

(51) Int. Cl.
  *H03H 9/02* (2006.01)
  *H03H 9/58* (2006.01)

(56) References Cited

U.S. PATENT DOCUMENTS

| | | | | |
|---|---|---|---|---|
| 9,246,079 B2* | 1/2016 | Umeda | ............... | H01L 41/18 |
| 9,385,684 B2* | 7/2016 | Nikkel | ............... | H03H 9/02118 |
| 2004/0246075 A1* | 12/2004 | Bradley | ............... | H03H 3/04 |
| | | | | 333/187 |
| 2004/0263286 A1* | 12/2004 | Unterberger | ............... | H03H 9/605 |
| | | | | 333/187 |
| 2008/0051039 A1* | 2/2008 | Iwasaki | ............... | H03H 9/173 |
| | | | | 455/73 |
| 2008/0296529 A1* | 12/2008 | Akiyama | ............... | B81B 3/0021 |
| | | | | 252/62.9 PZ |
| 2013/0127300 A1* | 5/2013 | Umeda | ............... | H01L 41/18 |
| | | | | 310/365 |
| 2014/0354109 A1* | 12/2014 | Grannen | ............... | H03H 9/02015 |
| | | | | 310/311 |
| 2015/0333248 A1* | 11/2015 | Moulard | ............... | H01H 1/0036 |
| | | | | 333/133 |
| 2015/0333249 A1* | 11/2015 | Moulard | ............... | H03H 3/02 |
| | | | | 310/367 |
| 2015/0381144 A1* | 12/2015 | Bradley | ............... | H03H 3/02 |
| | | | | 333/132 |
| 2019/0089325 A1* | 3/2019 | Yanagitani | ............... | H03H 9/02015 |

* cited by examiner

BULK ACOUSTIC WAVE RESONATOR WITH MULTILAYER PIEZOELECTRIC STRUCTURE

RELATED APPLICATIONS

This application claims the benefit of provisional patent application Ser. No. 62/434,838, filed Dec. 15, 2016, the disclosure of which is hereby incorporated herein by reference in its entirety.

FIELD OF THE DISCLOSURE

The present disclosure relates to Bulk Acoustic Wave (BAW) resonators and in particular to a BAW resonator with a multilayer piezoelectric structure.

BACKGROUND

Acoustic resonators, and particularly Bulk Acoustic Wave (BAW) resonators, are used in many high frequency communication applications. In particular, BAW resonators are often employed in filter networks that operate at frequencies above 1.5 GHz and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices, and are destined to dominate filter applications for 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

SUMMARY

A bulk acoustic wave (BAW) resonator is disclosed comprising a bottom electrode, a top electrode over the bottom electrode, and a multilayer piezoelectric structure between the bottom electrode and the top electrode. The multilayer piezoelectric structure has a first piezoelectric layer having a first electromechanical coupling coefficient and a second piezoelectric layer having a second electromechanical coupling coefficient that is different than the first electromechanical coupling coefficient.

The first electromechanical coupling coefficient differs from the second electromechanical coupling coefficient by at least 2%, 3%, 4%, and 5% in different embodiments. In one embodiment, the first electromechanical coupling coefficient falls in the range of 3% to 6%, and the second electromechanical coupling coefficient falls in the range of 8% to 12%. In another embodiment, the first electromechanical coupling coefficient falls in the range of 2% to 6%, and the second electromechanical coupling coefficient falls in the range of 8% to 15%.

In certain embodiments, the first piezoelectric layer comprises a first material that is not doped, and the second piezoelectric layer includes the first material that is doped. In other embodiments, the first piezoelectric layer includes a first material that is doped at a first level, and the second piezoelectric layer includes the same first material, which is doped at a different level than the first level. Further, the first piezoelectric layer and the second piezoelectric layer may have a same crystallographic orientation.

In one embodiment, the first piezoelectric layer resides on the bottom electrode, the second piezoelectric layer resides on the first piezoelectric layer, and the first electromechanical coupling coefficient is greater than the second electromechanical coupling coefficient. In another embodiment, the first piezoelectric layer resides on the bottom electrode, the second piezoelectric layer resides on the first piezoelectric layer, and the first electromechanical coupling coefficient is less than the second electromechanical coupling coefficient.

In one embodiment, the first piezoelectric layer consists of aluminum nitride and the second piezoelectric layer consists of aluminum nitride doped with a transition metal. In another embodiment, the first piezoelectric layer comprises aluminum nitride and the second piezoelectric layer comprises aluminum nitride doped with a transition metal, such as scandium. Other materials, dopants, and the like are envisioned, as described further below.

In one embodiment, a filter is provided that includes at least first and second BAW resonators that are electrically coupled together in a ladder network, or like network configuration. The first BAW resonator includes a first bottom electrode, a first top electrode over the first bottom electrode, and a first multilayer piezoelectric structure between the first bottom electrode and the first top electrode. The multilayer piezoelectric structure includes a first piezoelectric layer having a first electromechanical coupling coefficient and a second piezoelectric layer having a second electromechanical coupling coefficient that is different than the first electromechanical coupling coefficient. Similarly, the second BAW resonator includes a second bottom electrode, a second top electrode over the second bottom electrode, and a second multilayer piezoelectric structure between the second bottom electrode and the second top electrode. The second multilayer piezoelectric structure has a third piezoelectric layer having a third electromechanical coupling coefficient and a fourth piezoelectric layer having a fourth electromechanical coupling coefficient that is different than the third electromechanical coupling coefficient. A thickness of the first piezoelectric layer may be different than a thickness of the third piezoelectric layer, and a thickness of the second piezoelectric layer may be different than a thickness of the third and fourth piezoelectric layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
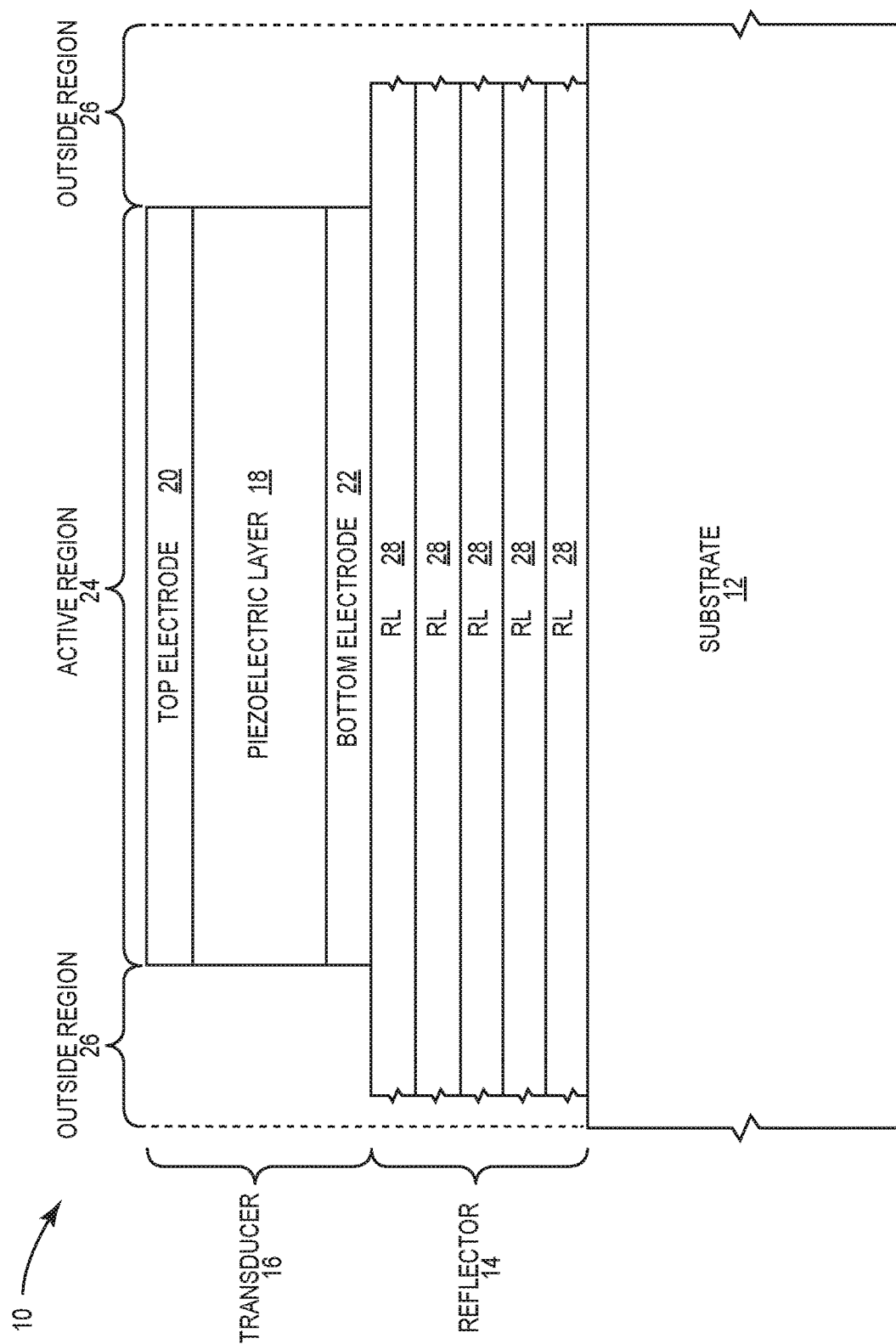
FIG. 1 illustrates a conventional Bulk Acoustic Wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Prior to delving into further detail, an overview of BAW resonators and filter networks that employ BAW resonators is provided. BAW resonators are used in many high-frequency filter applications. An exemplary BAW resonator 10 is illustrated in FIG. 1. The BAW resonator 10 is a solidly mounted resonator (SMR) type BAW resonator 10 and generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), or like material, and the piezoelectric layer 18 may be formed of Aluminum Nitride (AlN), Zinc Oxide (ZnO) or other appropriate piezoelectric material. Although shown in FIG. 1 as including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these verticallypropagating acoustic waves in the transducer 16. Acoustic waves traveling upwardly are reflected back into the transducer 16 by the air-metal boundary at the top surface of the top electrode 20. Acoustic waves traveling downwardly are reflected back into the transducer 16 by the reflector 14, or by an air cavity, which is provided just below the transducer in a Film BAW Resonator (FBAR).

The reflector 14 is typically formed by a stack of reflector layers (RL) 28A through 28E, which alternate in material composition to produce a significant reflection coefficient at the junction of adjacent reflector layers 28. Typically, the reflector layers 28A through 28E alternate between materials having high and low acoustic impedances, such as tungsten (W) and silicon dioxide ($SiO_2$). While only five reflector layers 28A through 28E are illustrated in FIG. 1, the number of reflector layers 28 and the structure of the reflector 14 will vary from one design to another.

Figure 2:
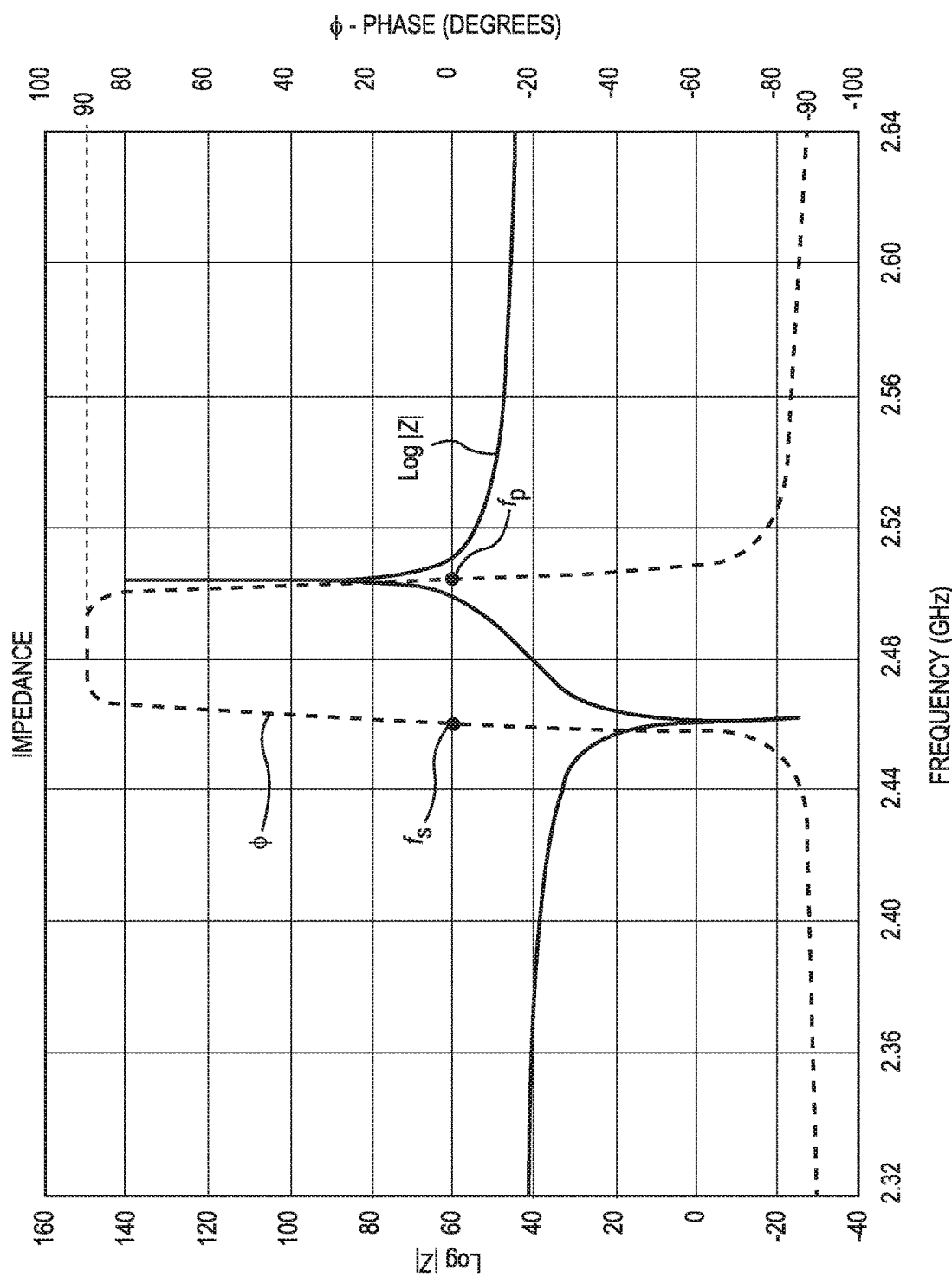
FIG. 2 is a graph of the magnitude and phase of impedance over frequency responses as a function of frequency for an ideal BAW resonator.

The magnitude (Z) and phase (ϕ) of the electrical impedance as a function of the frequency for a relatively ideal BAW resonator 10 is provided in FIG. 2. The magnitude (Z) of the electrical impedance is illustrated by the solid line, while the phase (ϕ) of the electrical impedance is illustrated by the dashed line. A unique feature of the BAW resonator 10 is that it has both a resonance frequency and an anti-resonance frequency. The resonance frequency is typically referred to as the series resonance frequency ($f_s$), and the anti-resonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness of the piezoelectric layer 18 and the mass of the bottom and top electrodes 20 and 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency (fs), and a very high resistance at the parallel resonance frequency ($f_p$). The electrical nature of the BAW resonator 10 lends itself to the realization of a very high Q (quality coefficient) inductance over a relatively short range of frequencies, which has proven to be very beneficial in high frequency filter networks, especially those operating at frequencies around 1.8 GHz and above.

Figure 3:
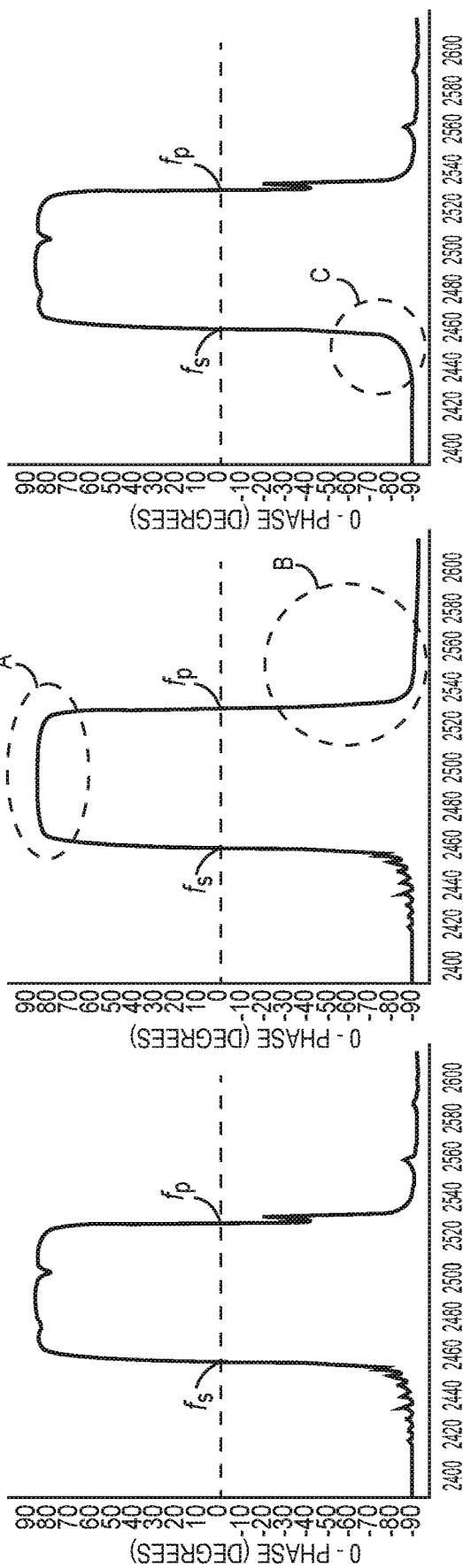
FIGS. 3A-3C are graphs of phase responses for various BAW resonator configurations.

Unfortunately, the phase (ϕ) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

Figure 4:
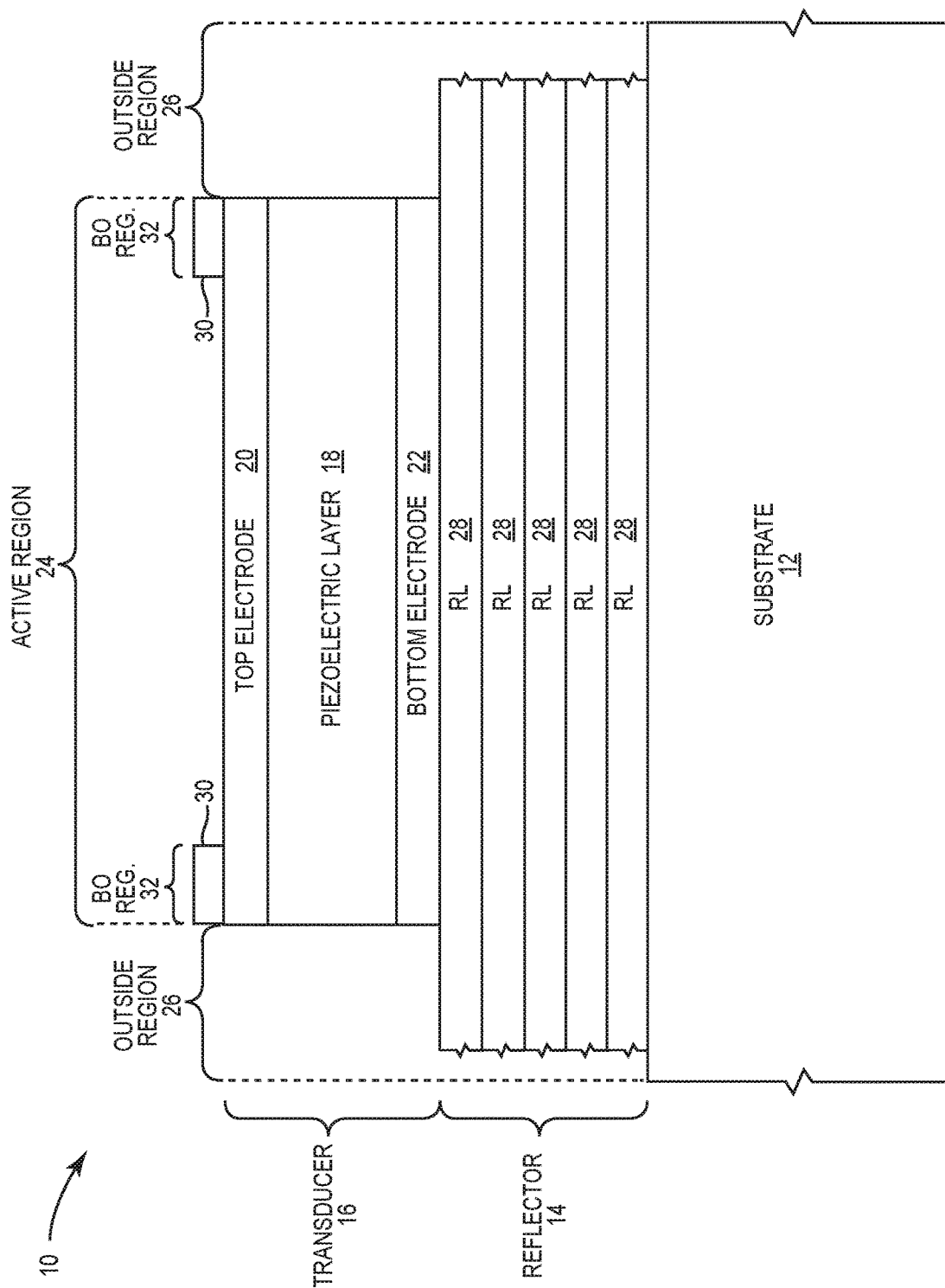
FIG. 4 illustrates a conventional BAW resonator with a border ring.

As illustrated in FIG. 4, a border (BO) ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus the spurious mode, in the passband of the phase curve, which resides between the series resonance frequency ($f_s$) and the parallel resonance frequency ($f_p$). Circle B shows suppression of the ripple, and thus the spurious modes, above the parallel resonance frequency ($f_p$). Notably, the spurious mode in the upper shoulder of the passband, which is just below the parallel resonance frequency $f_p$, and the spurious modes above the passband are suppressed, as evidenced by the smooth or substantially ripple free phase curve between the series resonance frequency ($f_s$) and the parallel resonance frequency ($f_p$) and above the parallel resonance frequency ($f_p$).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency ($f_s$), the BO ring 30 has little or no impact on those spurious modes below the series resonance frequency ($f_s$), as shown in FIG. 3B. A technique referred to as apodization is often used to suppress the spurious modes that fall below the series resonance frequency ($f_s$).

Apodization works to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed. Assuming no BO ring 30 is provided, one can readily see in FIG. 3C that apodization fails to suppress those spurious modes above the series resonance frequency ($f_s$). As such, the typical BAW resonator 10 employs both apodization and the BO ring 30.

Figure 5A:
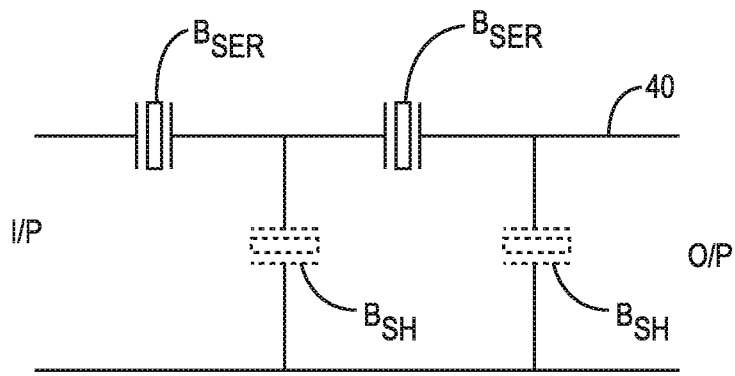
FIG. 5A is a schematic of a conventional ladder network.
Figure 5B:
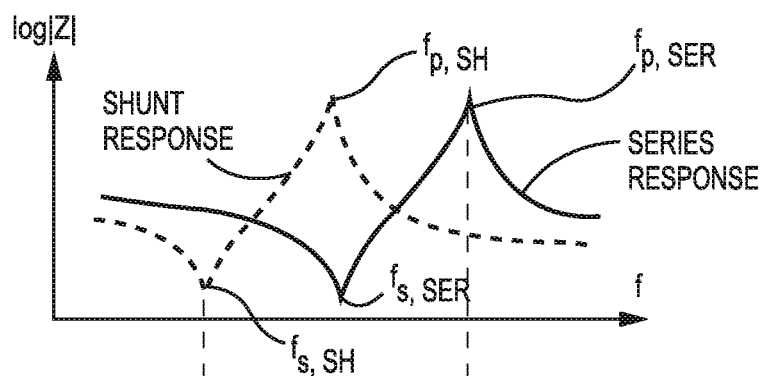
FIGS. 5B and 5C are graphs of a frequency response for BAW resonators in the conventional ladder network of FIG. 5A and a frequency response for the conventional ladder network of FIG. 5A.

As noted above, BAW resonators 10 are often used in filter networks that operate at high frequencies and require high Q values. A basic ladder network 40 is illustrated in FIG. 5A. The ladder network 40 includes two series resonators $B_{SER}$ and two shunt resonators $B_{SH}$, which are arranged in a traditional latter configuration. Typically, the series resonators $B_{SER}$ have the same or similar first frequency response, and the shunt resonators $B_{SH}$ have the same or similar second frequency response, which is different than the first frequency response, as shown in FIG. 5B. In many applications, the shunt resonators $B_{SH}$ are detuned versions of the series resonators $B_{SER}$. As a result, the frequency responses for the series resonators $B_{SER}$ and the shunt resonators $B_{SH}$ are generally very similar, yet shifted relative to one another such that the parallel resonance frequency ($f_{P,SH}$), of the shunt resonators approximates the series resonance frequency ($f_{S,SER}$), of the series resonators $B_{SER}$. Note that the series resonance frequency ($f_{S,SH}$) of the shunt resonators $B_{SH}$ is less than the series resonance frequency ($f_{S,SER}$) of the series resonators $B_{SER}$. The parallel resonance frequency ($f_{S,SH}$) of the shunt resonators $B_{SH}$ is less than the parallel resonance frequency ($f_{P,SER}$) of the series resonators $B_{SER}$.

Figure 5C:
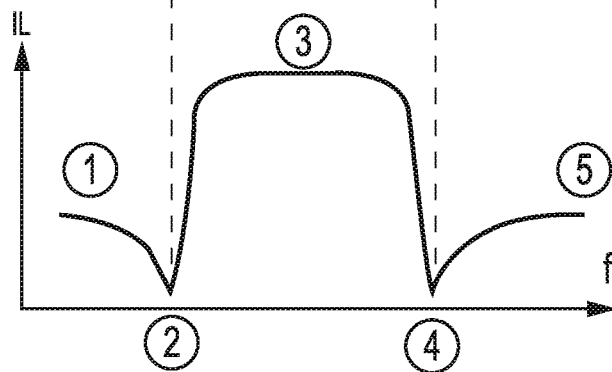

FIG. 5C is associated with FIG. 5B and illustrates the response of the ladder network 40. The series resonance frequency ($f_{S,SH}$) of the shunt resonators $B_{SH}$ corresponds to the low side of the passband's skirt (phase 2), and the parallel resonance frequency ($f_{P,SER}$) of the series resonators $B_{SER}$ corresponds to the high side of the passband's skirt (phase 4). The substantially aligned series resonance frequency ($f_{S,SER}$) of the series resonators $B_{SER}$ and the parallel resonance frequency ($f_{S,SH}$) of the shunt resonators $B_{SH}$ fall within the passband. FIGS. 6A through 6E provide circuit equivalents for the five phases of the response of the ladder network 40. During the first phase (phase 1, FIGS. 5C, 6A), the ladder network 40 functions to attenuate the input signal. As the series resonance frequency ($f_{S,SH}$) of the shunt resonators $B_{SH}$ is approached, the impedance of the shunt resonators $B_{SH}$ drops precipitously, such that the shunt resonators $B_{SH}$ essentially provide a short to ground at the series resonance frequency ($f_{S,SH}$) of the shunt resonators (phase 2, FIGS. 5C, 6B). At the series resonance frequency ($f_{S,SH}$) of the shunt resonators $B_{SH}$ (phase 2), the input signal is essentially blocked from the output of the ladder network 40.

Figure 6A:
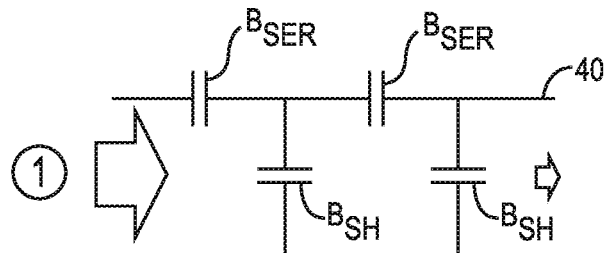
FIGS. 6A-6E are circuit equivalents for the ladder network of FIG. 5A at the frequency points 1, 2, 3, 4, and 5, which are identified in FIG. 5C.
Figure 6B:
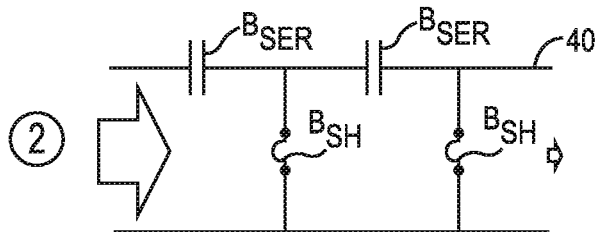
Figure 6C:
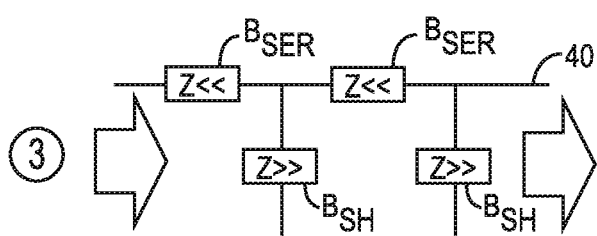
Figure 6D:
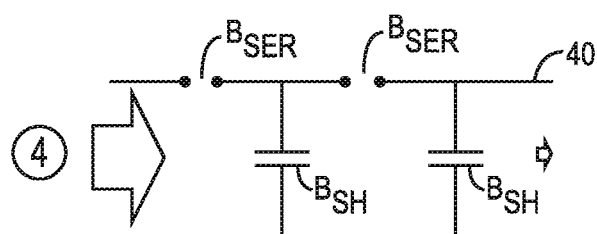
Figure 6E:
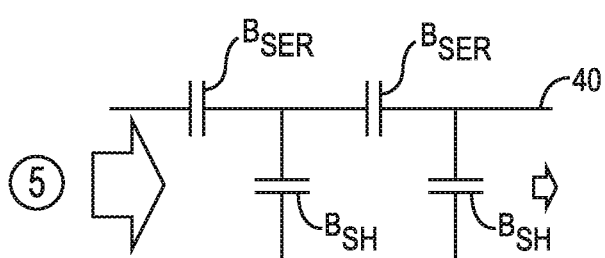

Between the series resonance frequency ($f_{S,SH}$) of the shunt resonators $B_{SH}$ and the parallel resonance frequency ($f_{P,SER}$) of the series resonators $B_{SER}$, which corresponds to the passband, the input signal is passed to the output with relatively little or no attenuation (phase 3, FIGS. 5C, 6C). Within the passband, the series resonators $B_{SER}$ present relatively low impedance, while the shunt resonators $B_{SH}$ present a relatively high impedance, wherein the combination of the two leads to a flat passband was steep low and high-side skirts. As the parallel resonance frequency ($f_{P,SER}$) of the series resonators $B_{SER}$ is approached, the impedance of the series resonators $B_{SER}$ becomes very high, such that the series resonators $B_{SER}$ essentially present themselves as an open at the parallel resonance frequency ($f_{P,SER}$) of the series resonators (phase 4, FIGS. 5C, 6D). At the parallel resonance frequency ($f_{P,SER}$) of the series resonators $B_{SER}$ (phase 4), the input signal is again essentially blocked from the output of the ladder network 40.

During the final phase (phase 5, FIGS. 5C, 6E), the ladder network 40 functions to attenuate the input signal, in a similar fashion to that provided in phase 1. As the parallel resonance frequency ($f_{P,SER}$) of the series resonators $B_{SER}$ is passed, the impedance of the series resonators $B_{SER}$ decreases, and the impedance of the shunt resonators $B_{SH}$ normalize. Thus, the ladder network 40 functions to provide a high Q passband between the series resonance frequency ($f_{S,SH}$) of the shunt resonators $B_{SH}$ and the parallel resonance frequency ($f_{P,SER}$) of the series resonators $B_{SER}$. The ladder network 40 provides extremely high attenuation at both the series resonance frequency ($f_{S,SH}$) of the shunt resonators $B_{SH}$ and the parallel resonance frequency ($f_{P,SER}$) of the series resonators. The ladder network 40 provides good attenuation below the series resonance frequency ($f_{S,SH}$) of the shunt resonators $B_{SH}$ and above the parallel resonance frequency ($f_{P,SER}$) of the series resonators $B_{SER}$.

In a single modern communication system, such as a mobile telephone, there are numerous filters requiring passbands of different bandwidths and centered at different frequencies. The center frequencies of filters that employ BAW resonators 10 are primarily governed by the thicknesses of the various layers of the transducer 16, and in particular, the thickness of the piezoelectric layer 18. The passband bandwidths and shapes of the band edges of the filters are primarily governed by the electromechanical coupling coefficient k of the piezoelectric layer 18. An electromechanical coupling coefficient k is the measure of the effectiveness of the piezoelectric layer in converting electrical energy to mechanical energy, and vice versa. Different piezoelectric materials or material compositions will generally have different electromechanical coupling coefficients k.

For passbands having bandwidths less than 75 MHz, aluminum nitride (AlN) is a common choice for the piezoelectric layer 18. For passbands having bandwidths greater than 75 MHz, newer piezoelectric materials that provide an increased electromechanical coupling coefficient k are being employed. These newer piezoelectric materials include but are not limited to aluminum nitride that has been doped with one or more transition metals, such as scandium (Sc), yttrium (Y), magnesium (Mg), zirconium (Zr), and the like, alone or in combination with other materials such as Erbium (Er), Magnesium (Mg) and the like. Exemplary piezoelectric materials include, but are not limited to ScAlN, YAlN, [Mg][Zr]AlN, [Sc][Er]AlN, and the like.

Unfortunately, each of these piezoelectric materials has a fairly specific electromechanical coupling coefficient k. As a result, designers currently have to pick a particular piezoelectric material, and then design the rest of the BAW resonator 10 and the filters that employ the BAW resonator 10 around the electromechanical coupling coefficient k of the chosen piezoelectric material. In other words, the choice of the piezoelectric material for the piezoelectric layer 18 restricts the electromechanical coupling coefficient k, and as such, ultimately limits the ability of the designer to optimize the performance of the overall filter design.

Figure 7:
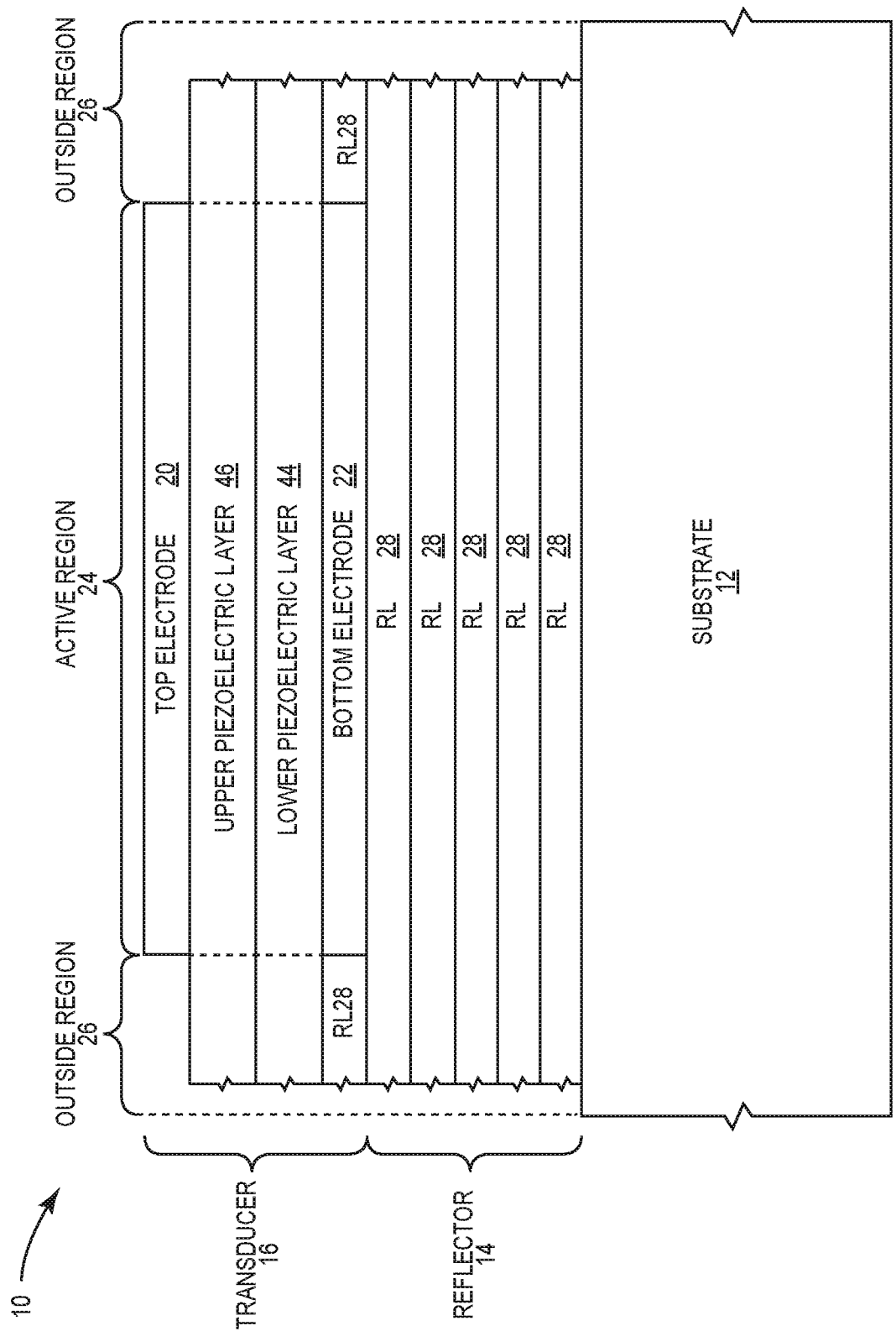
FIG. 7 illustrates a BAW resonator having a multilayer piezoelectric structure according to one embodiment of the present disclosure.

Disclosed herein is a multilayer piezoelectric structure that allows designers to more precisely control the electromechanical coupling coefficient k of the multilayer piezoelectric structure and assets, and to develop more optimized BAW resonators 10 and filters that employ the BAW resonators 10. With reference to FIG. 7, a BAW resonator 10 is configured with an exemplary multilayer piezoelectric structure 42 as opposed to the single-layer piezoelectric layer 18 described in the above embodiments. The remaining elements of the BAW resonator 10 are essentially the same.

The multilayer piezoelectric structure 42 includes two or more piezoelectric layers, which are illustrated as a lower piezoelectric layer 44 and an upper piezoelectric layer 46. The lower piezoelectric layer 44 resides over the bottom electrode 22, and the upper piezoelectric electric layer 46 resides over the lower piezoelectric layer 44 such that the lower and upper piezoelectric layers 44, 46 are sandwiched between the top and bottom electrodes 20, 22. The lower and upper piezoelectric layers 44, 46 may extend outside of the active region 24. Further, supplemental reflector layers RLS may be provided laterally about the bottom electrode 22 and over the reflector 14. Intermediate piezoelectric layers, which are not shown, may be provided between the lower and upper piezoelectric layers 44, 46.

For the concepts disclosed herein, the lower and upper piezoelectric layers 44, 46 have different electromechanical coupling coefficients: kl and ku, respectively. The different electromechanical coupling coefficients kl, ku of the lower and upper piezoelectric layers 44, 46 effectively combine to provide an effective electromechanical coupling coefficient ke for the overall multilayer piezoelectric structure 42 that may fall between the electromechanical coupling coefficients kl, ku of the lower and upper piezoelectric layers 44, 46.

In one embodiment, the lower and upper piezoelectric layers 44, 46, as well as any intermediate piezoelectric layers there between, have the same crystallographic orientation with good lattice matching between adjacent layers to provide good composite behavior from an electromechanical coupling perspective. For more optimal results, the lower and upper piezoelectric layers 44, 46, and any intermediate piezoelectric layers therebetween, are deposited using an appropriate deposition process, such as physical vapor deposition (PVD), without breaking the vacuum between depositions. If there is a vacuum break, high-energy argon (Ar) sputtering may be required on the surface of the first piezoelectric layer prior to depositing a second piezoelectric layer.

For a dual-layer piezoelectric structure 42, the effective electromechanical coupling coefficient ke may be represented as ke is approximately equal to $x*ku+(1-x)kl$, where x is the ratio of the thickness of the upper piezoelectric layer 46 to the combined thickness of the lower and upper piezoelectric layers 44, 46 and the upper electromechanical coupling coefficient ku is greater than the lower electromechanical coupling coefficient kl. In other embodiments, the upper electromechanical coupling coefficient ku may be less than the lower electromechanical coupling coefficient kl, and as such, the effect of electromechanical coupling coefficient ke may be represented as ke is approximately equal to $y*ku+(1-y)kl$, where y is the ratio of the thickness of the lower piezoelectric layer 44 to the combined thickness of the lower and upper piezoelectric layers 44, 46. Notably, the phrase "approximately equal to" is defined to mean that the effective electromechanical coupling coefficient ke is within +/−10 percent (10%) of the result of the equations. For example, if the result of the equation is an electromechanical coupling coefficient of 10%, the effective electromechanical coupling coefficient ke may range between 9% and 11%, which is +/−10% of 10%.

In one embodiment, the electromechanical coupling coefficient ku of the upper piezoelectric layer 46 is higher than the electromechanical coupling coefficient kl of the lower piezoelectric layer 44. For a given dual-layer piezoelectric structure 42, the effective electromechanical coupling coefficient ke for the piezoelectric structure 42 may range between the electromechanical coupling coefficient ku of the upper piezoelectric layer 46 and the electromechanical coupling coefficient kl of the lower piezoelectric layer 44, depending on the ratio of the thicknesses for the lower and upper piezoelectric layers 44, 46 (ku>ke>kl). As such, a designer can precisely "tune" the effective electromechanical coupling coefficient ke for the piezoelectric structure 42 to by controlling the ratio of the thicknesses of the lower and upper piezoelectric layers 44, 46. Notably, the operating frequency of the BAW resonator 10 is primarily dictated based on the thickness of the overall piezoelectric structure 42 as well as the thicknesses of the top and bottom electrodes 20, 22.

Figure 8:
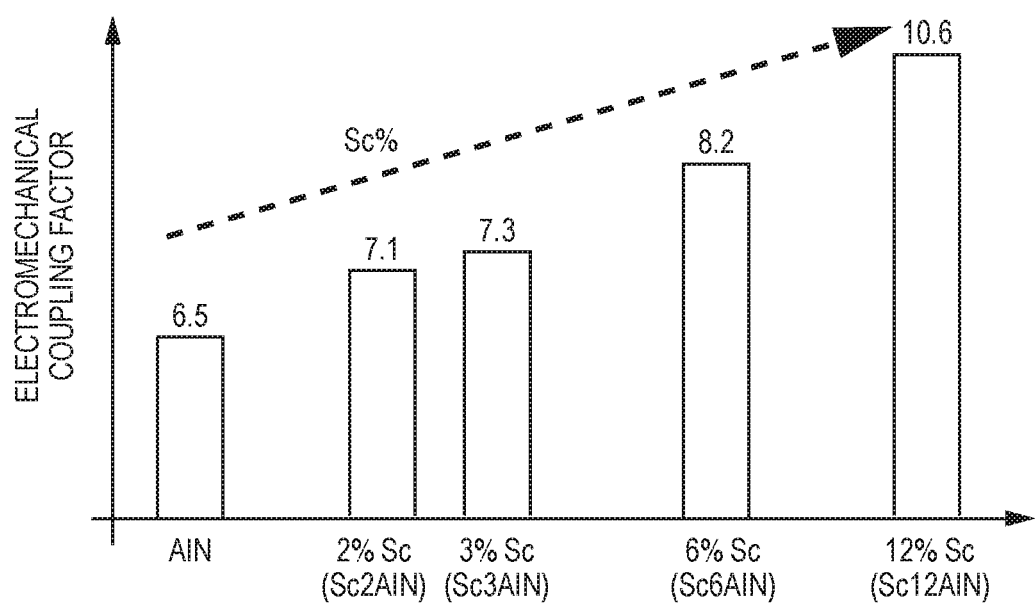
FIG. 8 is a plot of electromechanical coupling coefficient versus doping percentage for scandium doped aluminum nitride.

Turning now to FIG. 8, a chart is provided to show how doping a piezoelectric material affects the electromechanical coupling coefficient of the piezoelectric material. In this instance, the piezoelectric material is aluminum nitride (AlN) and the dopant is scandium (Sc). For undoped aluminum nitride, the electromechanical coupling coefficient k is approximately 6.5%. When the aluminum nitride piezoelectric material is doped with 2%, 3%, 6%, and 12% scandium, the resulting electromechanical coupling coefficients k for the piezoelectric material are 7.1%, 7.3%, 8.2%, and 10.6%, respectively. In general, the electromechanical coupling coefficient k increases with doping concentration. The doping percentages recited herein refer to atomic percentages, wherein aluminum nitride doped with 9% scandium means that there are nine scandium atoms for every 100 scandium and aluminum nitride atoms on average. A shorthand form for this example would be Sc9AlN, wherein the "9" in Sc9AlN represents the atomic percentage of scandium in the scandium doped with AlN piezoelectric material (ScAlN).

Figure 9:
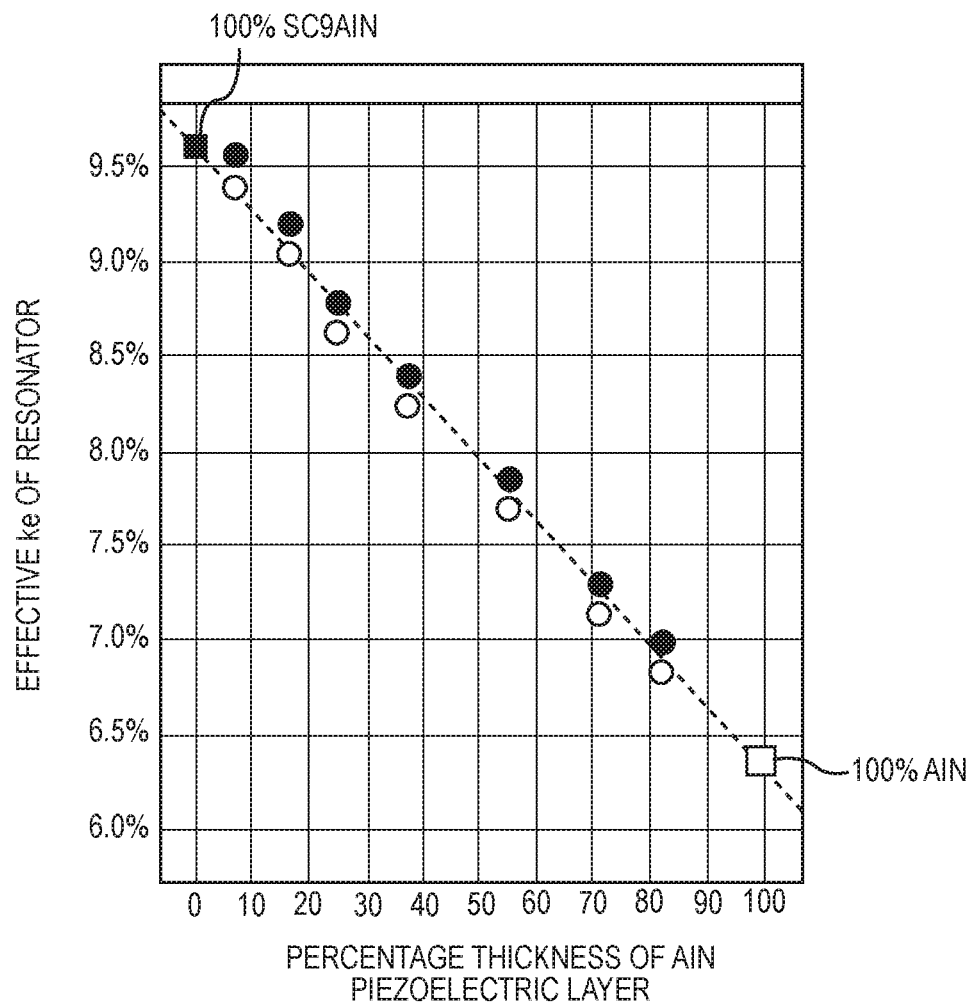
FIG. 9 is a plot of effective electromechanical coupling coefficient versus the ratio of layer thicknesses within the multilayer piezoelectric structure.

Turning now to FIG. 9, a graph is provided to illustrate the effective electromechanical coupling coefficient ke for a BAW resonator 10 over varying thicknesses of the lower and upper piezoelectric layers 44, 46 wherein one of the lower and upper piezoelectric layers 44, 46 is formed from undoped aluminum nitride (AlN) and the other is formed from 9% scandium doped aluminum nitride (Sc9AlN). The horizontal axis represents the percentage thickness of the undoped aluminum nitride layer relative to the overall thickness of the dual-layer piezoelectric structure 42. The circular open points on the graph correspond to an embodiment wherein the aluminum nitride layer is the lower piezoelectric layer 44 and the SC9AlN layer is the upper piezoelectric layer 46. The circular solid points on the graph correspond to an embodiment wherein the aluminum nitride layer is the upper piezoelectric layer 46 and the Sc9AlN layer is the lower piezoelectric layer 44. The square open point corresponds to the piezoelectric structure 42 being a single layer of aluminum nitride. The square closed point corresponds to the piezoelectric structure 42 being a single layer of Sc9AlN.

From the graph, the effective electromechanical coupling coefficient ke is generally slightly higher in the embodiment where the upper piezoelectric layer 46 is doped aluminum nitride (i.e. Sc9Aln) and the lower piezoelectric layer 44 is undoped aluminum nitride. When the piezoelectric structure 42 is essentially a single layer of 100% aluminum nitride, the effective electromechanical coupling coefficient ke is approximately 6.5%, wherein when the piezoelectric structure 42 is essentially a single layer of doped aluminum nitride (i.e. Sc9AlN), the effective electromechanical coupling coefficient ke is approximately 9.7%. From the graph of FIG. 9, one can readily see how the relative thicknesses of the lower and upper piezoelectric layers 44, 46 of a dual-layer piezoelectric structure 42 can be chosen to achieve a specific effective electromechanical coupling coefficient ke for the piezoelectric structure 42. In the illustrated embodiment, the effective electromechanical coupling coefficient ke can range from approximately 6.5% to approximately 9.7% based on the ratio of thicknesses of the lower and upper piezoelectric layers 44, 46. All things being equal, providing the material with the higher electromechanical coupling coefficient k for the lower piezoelectric layer 44 and the material with the lower electromechanical coupling coefficient k for the upper piezoelectric layer 46 provides a higher effective electromechanical coupling coefficient ke than providing the material with the lower mechanical coupling coefficient k for the lower piezoelectric layer 44 and the material with the higher electromechanical coupling coefficient k for the upper piezoelectric layer 46. In certain embodiments, two or more, including all, of the Piezo electric layers of the piezoelectric structure 42 may be doped.

Even though aluminum nitride is used as the base material composition for the embodiments described herein, these piezoelectric layers may have the same or different base material compositions in other embodiments. Those skilled in art will appreciate that different piezoelectric materials and doping levels for one or more of the lower and upper piezoelectric layers 44, 46 may be used and are considered disclosed herein. For example, the lower and upper piezoelectric layers 44, 46 may be formed from the same or different materials and have the same or different doping levels of the same or different dopants. The specific examples are purely for illustrative purposes, and are not intended to be limiting in any manner.

Figure 10:
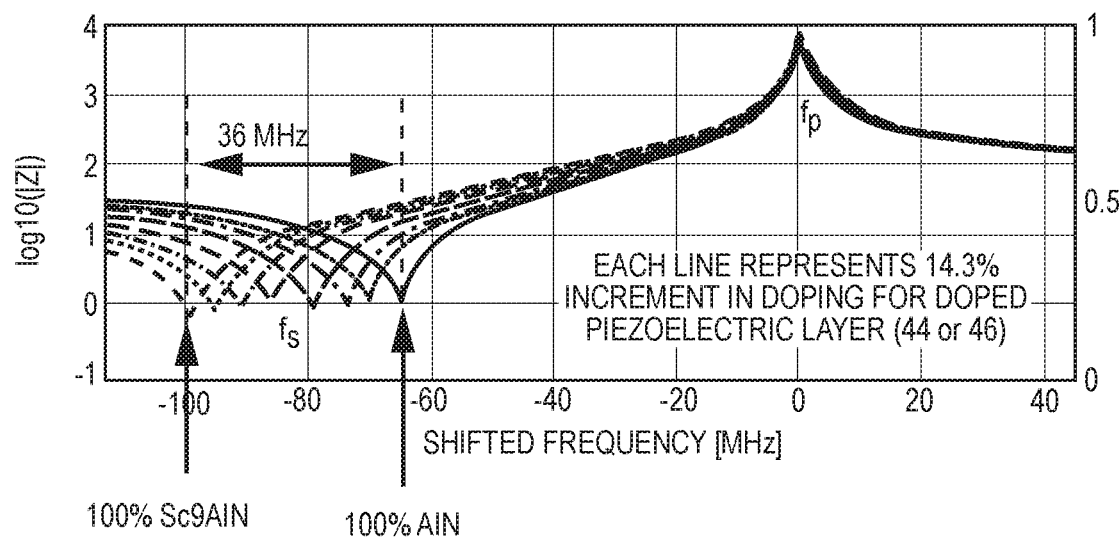
FIG. 10 is a graph of the magnitude of impedance as a function of frequency for different ratios of layer thicknesses within the multilayer piezoelectric structure for a BAW resonator.

Turning now to FIG. 10, a plot of impedance versus frequency is provided for a BAW resonator 10 with different thickness ratios in an embodiment wherein the lower piezoelectric layer 44 is formed from aluminum nitride and the upper piezoelectric layer 46 is formed from Sc9AlN. The plot ranges from the piezoelectric structure 42 being formed from 100% Sc9AlN to 0% Sc9AlN (100% AlN) in 14.3% thickness ratio increments (100%, 85.8%, 71.5%, 57.2%, 42.9%, 28.6%, 14.3%, 0%) for the upper piezoelectric layer 46. Notably, the embodiments where the piezoelectric structure 42 is 100% Sc9AlN or 100% AlN employ effectively a single-layer instead of a dual-layer configuration for a piezoelectric structure 42 of a given overall thickness, regardless of the number of piezoelectric layers. The other embodiments employ a dual-layer configuration for the piezoelectric structure 42. The single-layer variants are provided for reference.

Figure 11:
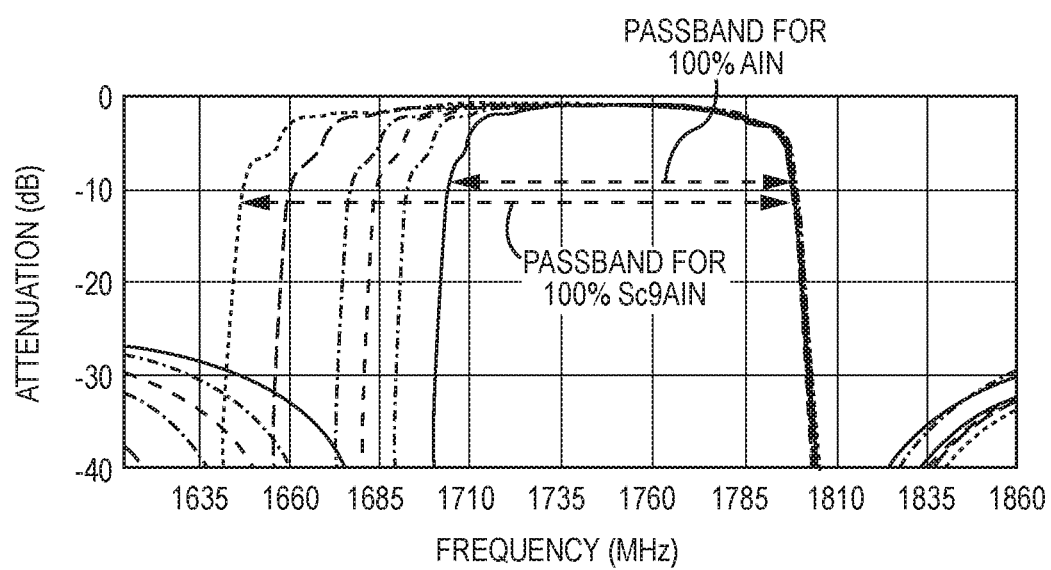
FIG. 11 is a graph of amplitude as a function of frequency for different ratios of layer thicknesses within the multilayer piezoelectric structure of BAW resonators in a BAW filter.

From the plot of FIG. 10, one can clearly see that the spread between the series resonance frequency $f_s$ and the parallel resonance frequency $f_p$ increases as the relative thickness of the upper piezoelectric layer 46, which in this embodiment has the higher electromechanical coupling coefficient, increases for a given BAW resonator 10. When these BAW resonators 10 are implemented in a ladder network 40, increases in the spread between the series resonance frequency $f_s$ and the parallel resonance frequency $f_p$ translate to wider passbands for the ladder network 40, as illustrated in FIG. 11.

As indicated above, the piezoelectric structure 42 may include two or more layers, such as the lower piezoelectric layer 44 and the upper piezoelectric layer 46. Those piezoelectric layers of the piezoelectric structure 42 that include piezoelectric materials with higher coupling coefficients may be provided in either of the lower or upper layers of the piezoelectric structure 42. In one embodiment, the electromechanical coupling coefficient k of a first piezoelectric layer is at least 1.5 times that of a second piezoelectric layer of the piezoelectric structure 42. In another embodiment, the electromechanical coupling coefficient k of a first piezoelectric layer is at least two times that of a second piezoelectric layer of the piezoelectric structure 42.

In other embodiments, the electromechanical coupling coefficient k1 of the first piezoelectric layer in the piezoelectric structure 42 differs from the electromechanical coupling coefficient k2 of the second piezoelectric layer the piezoelectric structure 42 by at least 2%, 3%, 4%, or 5% (i.e. for a difference of 5%, k1=5% and k2=10%). In yet another embodiment, the electromechanical coupling coefficient k1 of the first piezoelectric layer in the piezoelectric structure 42 falls in the range of 3% to 6%, and the electromechanical coupling coefficient k2 of the second piezoelectric layer of the piezoelectric structure 42 falls in the range of 8% to 12%. Alternatively, the electromechanical coupling coefficient k1 of the first piezoelectric layer in the piezoelectric structure 42 falls in the range of 2% to 6%, and the electromechanical coupling coefficient k2 of the second piezoelectric layer of the piezoelectric structure 42 falls in the range of 8% to 15%.

Figure 12:
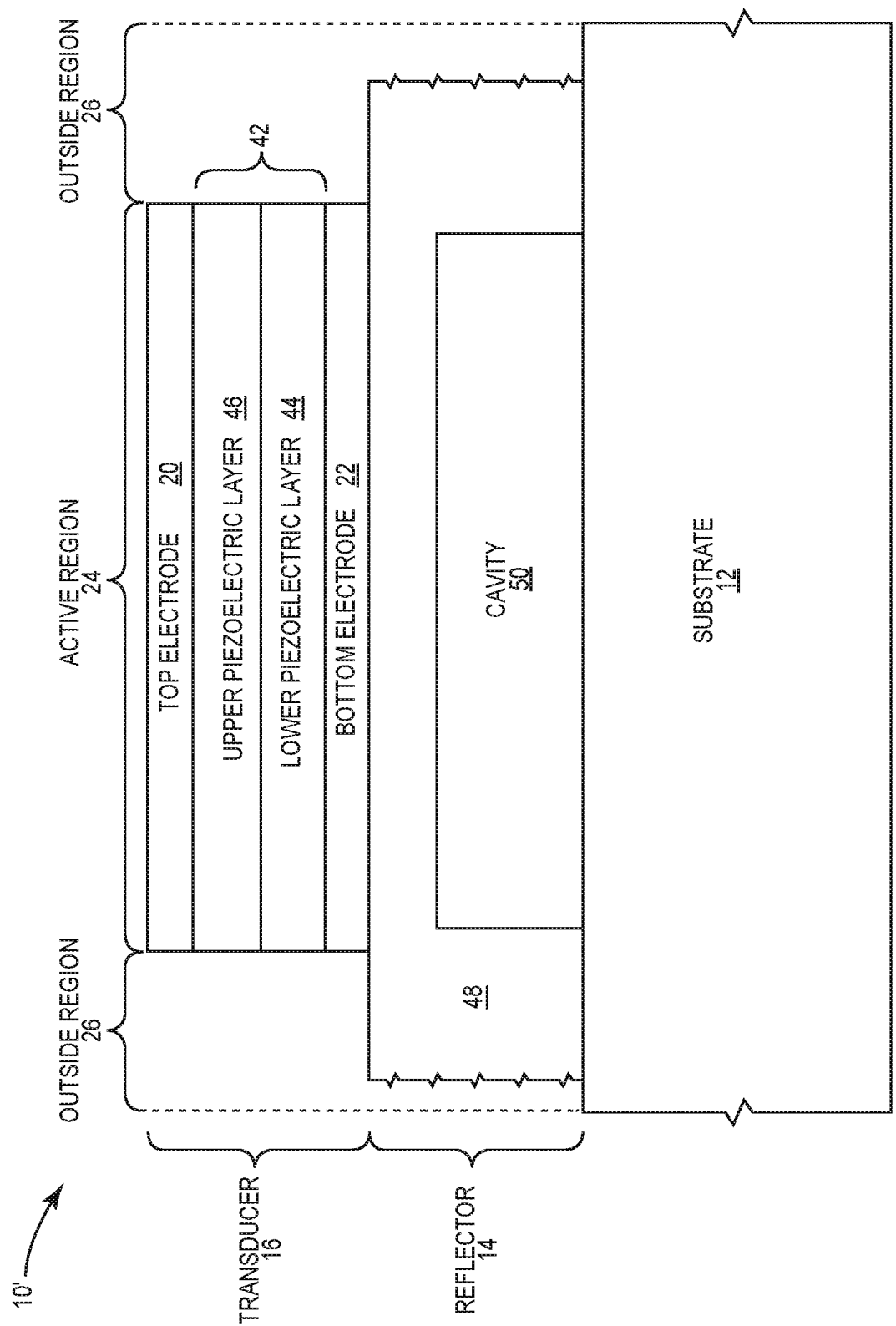
FIG. 12 illustrates a film BAW Resonator (FBAR) according to another embodiment of the disclosure.

The concepts described above may be implemented in various types of BAW resonator configurations, including the surface mounted resonator (SMR) BAW resonator 10 of FIG. 7 as well as the (FBAR) BAW resonator 10' of FIG. 12. For the configuration of FIG. 12, the reflector structure 14 is replaced with a mounting structure 48, which includes a cavity 50 beneath the active region 24 of the transducer 16. The piezoelectric structure 42, as in the embodiments described above, may include one or more piezoelectric layers, such as the lower and upper piezoelectric layers 44, 46.

Those skilled in the art will recognize improvements and modifications to the preferred embodiments of the present disclosure. All such improvements and modifications are considered within the scope of the concepts disclosed herein and the claims that follow.

What is claimed is:

1. A bulk acoustic wave (BAW) resonator comprising:
    a bottom electrode;
    a top electrode over the bottom electrode;
    a multilayer piezoelectric structure between the bottom electrode and the top electrode and comprising a first piezoelectric layer having a first electromechanical coupling coefficient and a second piezoelectric layer having a second electromechanical coupling coefficient that is different than the first electromechanical coupling coefficient;
    a reflector below the bottom electrode; and
    a supplemental reflector that is on the reflector and provided directly on a lateral side of the bottom electrode.

2. The BAW resonator of claim 1 wherein the first electromechanical coupling coefficient differs from the second electromechanical coupling coefficient by at least 2%.

3. The BAW resonator of claim 1 wherein the first electromechanical coupling coefficient differs from the second electromechanical coupling coefficient by at least 3%.

4. The BAW resonator of claim 1 wherein the first electromechanical coupling coefficient differs from the second electromechanical coupling coefficient by at least 4%.

5. The BAW resonator of claim 1 wherein the first electromechanical coupling coefficient differs from the second electromechanical coupling coefficient by at least 5%.

6. The BAW resonator of claim 1 wherein the first electromechanical coupling coefficient is 6.5% and the second electromechanical coupling coefficient falls in the range of 7.1% to 10.6%.

7. The BAW resonator of claim 1 wherein the first electromechanical coupling coefficient falls in the range of 6.5% to 7.3% and the second electromechanical coupling coefficient falls in the range of 8.2% to 10.6%.

8. The BAW resonator of claim 1 wherein the first piezoelectric layer comprises a first material that is not doped and the second piezoelectric layer comprises the first material that is doped.

9. The BAW resonator of claim 1 wherein the first piezoelectric layer comprises a first material that is doped at a first level and the second piezoelectric layer comprises the first material that is doped at a second level that is different than the first level.

10. The BAW resonator of claim 1 wherein the first piezoelectric layer and the second piezoelectric layer have a same crystallographic orientation.

11. The BAW resonator of claim 1 wherein the first piezoelectric layer resides on the bottom electrode, the second piezoelectric layer resides on the first piezoelectric layer, and the first electromechanical coupling coefficient is greater than the second electromechanical coupling coefficient.

12. The BAW resonator of claim 11 wherein the first electromechanical coupling coefficient differs from the second electromechanical coupling coefficient by at least 2%.

13. The BAW resonator of claim 11 wherein the first electromechanical coupling coefficient differs from the second electromechanical coupling coefficient by at least 5%.

14. The BAW resonator of claim 11 wherein the second electromechanical coupling coefficient is 6.5% and the first electromechanical coupling coefficient falls in the range of 7.1% to 10.6%.

15. The BAW resonator of claim 1 wherein the first piezoelectric layer resides on the bottom electrode, the second piezoelectric layer resides on the first piezoelectric layer, and the first electromechanical coupling coefficient is less than the second electromechanical coupling coefficient.

16. The BAW resonator of claim 15 wherein the first electromechanical coupling coefficient differs from the second electromechanical coupling coefficient by at least 2%.

17. The BAW resonator of claim 15 wherein the first electromechanical coupling coefficient differs from the second electromechanical coupling coefficient by at least 5%.

18. The BAW resonator of claim 15 wherein the first electromechanical coupling coefficient is 6.5% and the second electromechanical coupling coefficient falls in the range of 7.1% to 10.6%.

19. The BAW resonator of claim 1 wherein the first piezoelectric layer consists of aluminum nitride and the second piezoelectric layer consists of aluminum nitride doped with a transition metal.

20. The BAW resonator of claim 19 wherein the transition metal is scandium.

21. The BAW resonator of claim 1 wherein the first piezoelectric layer comprises aluminum nitride and the second piezoelectric layer comprises aluminum nitride doped with a transition metal.

22. The BAW resonator of claim 21 wherein the transition metal is scandium.

23. The BAW resonator of claim 1 wherein the reflector comprises a stack of reflector layers with alternating material compositions.

24. A filter comprising a first bulk acoustic wave (BAW) resonator electrically coupled to a second BAW resonator wherein:
the first BAW resonator comprises:
a first bottom electrode;
a first top electrode over the first bottom electrode;
a first multilayer piezoelectric structure between the first bottom electrode and the first top electrode and comprising a first piezoelectric layer having a first electromechanical coupling coefficient and a second piezoelectric layer having a second electromechanical coupling coefficient that is different than the first electromechanical coupling coefficient;
a first reflector below the first bottom electrode; and
a first supplemental reflector that is on the first reflector and provided directly on a lateral side of the first bottom electrode; and
the second BAW resonator comprises:
a second bottom electrode;
a second top electrode over the second bottom electrode;
a second multilayer piezoelectric structure between the second bottom electrode and the second top electrode and comprising a third piezoelectric layer having a third electromechanical coupling coefficient and a fourth piezoelectric layer having a fourth electromechanical coupling coefficient that is different than the third electromechanical coupling coefficient;
a second reflector below the second bottom electrode; and
a second supplemental reflector that is on the second reflector and provided directly on a lateral side of the second bottom electrode.

25. The filter of claim 24 wherein a ratio of a thickness of the first piezoelectric layer to a thickness of the second piezoelectric layer is different than a ratio of a thickness of the third piezoelectric layer to a thickness of the fourth piezoelectric layer.

* * * * *

UNITED STATES PATENT AND TRADEMARK OFFICE
CERTIFICATE OF CORRECTION

| | |
|---|---|
| PATENT NO. | : 10,727,809 B2 |
| APPLICATION NO. | : 15/826039 |
| DATED | : July 28, 2020 |
| INVENTOR(S) | : Jyothi Swaroop Sadhu and Maria Wang |

Page 1 of 1

It is certified that error appears in the above-identified patent and that said Letters Patent is hereby corrected as shown below:

In the Specification

Column 5, Lines 19 and 23, replace "phase (4))" with --phase ($\Phi$)--.

Signed and Sealed this
Eighth Day of September, 2020

Andrei Iancu
*Director of the United States Patent and Trademark Office*